United States Patent [19]

Hasegawa

[11] Patent Number: 5,677,692
[45] Date of Patent: Oct. 14, 1997

[54] HIGH-SPEED AND LOW-VOLTAGE DRIVEN ANALOG-TO-DIGITAL CONVERTER

[75] Inventor: Hiroshi Hasegawa, Tokyo, Japan

[73] Assignee: NEC Corporation, Tokyo, Japan

[21] Appl. No.: 585,761

[22] Filed: Jan. 11, 1996

[30] Foreign Application Priority Data

Jan. 13, 1995 [JP] Japan .................................. 7-004136

[51] Int. Cl.$^6$ .................................................. H03M 1/38
[52] U.S. Cl. ............................ 341/161; 341/158; 341/118; 341/120
[58] Field of Search .................................. 341/155, 158, 341/161, 118, 120

[56] References Cited

U.S. PATENT DOCUMENTS

| | | | |
|---|---|---|---|
| 5,047,772 | 9/1991 | Ribner | 341/156 |
| 5,416,485 | 5/1995 | Lee | 341/172 |
| 5,489,904 | 2/1996 | Hadidi | 341/156 |
| 5,499,027 | 3/1996 | Karanicolas et al. | 341/120 |

FOREIGN PATENT DOCUMENTS

| | | |
|---|---|---|
| 5243867 | 9/1993 | Japan . |
| 7135452 | 5/1995 | Japan . |

OTHER PUBLICATIONS

T. Kumamoto et al.; "An 8–bit High–Speed CMOS A/D Converter"; IEEE Journal of Solid–State Circuits, vol. SC–21, No. 6, Dec. 1986, pp. 976–982.

S.H. Lewis; "Optimizing the Stage Resolution in Pipelined, Multistage, Analog–to–Digital Converters for Video–Rate Applications"; IEEE Transactions on Circuits and Systems—II: Analog and Digital Signal Processing, vol. 39, No. 8, Aug. 1992, pp. 516–523.

D.G. Nairn et al.; "Algorithmic analogue–to–digital convertors using current–mode techniques"; IEE Proceedings, vol. 137, Pt. G, No. 2, Apr. 1990, pp. 163–168.

D. Macq; "A 10–Bit Pipelined Switched–Circuit A/D Converter"; IEEE Journal of Solid–State Circuits, vo. 29, No. 8, Aug. 1994, pp. 967–971.

Primary Examiner—Jeffrey A. Gaffin
Assistant Examiner—Jason L. W. Kost
Attorney, Agent, or Firm—Whitham, Curits, Whitham & McGinn

[57] ABSTRACT

An N-bit A/D converter comprises $2^N$ cells connected in cascade, wherein the start cell receives an input analog signal and each cell performs a determination operation to produce a determination signal. Each cell comprises a sample and hold circuit, a comparator, and a subtracter. The sample and hold circuit samples an analog value from a first analog signal received from a previous cell and holds the analog value. The comparator compares the analog value with a reference value to produce the determination signal. The subtracter subtracts a subtrahend value from the analog value to produce a second analog signal which is received by a next cell. The next cell receives the output of the cell as the above-mentioned first analog signal and performs the same determination operation as the cell. The cascade-connected cells are controlled with timing clocks so as to perform a pipeline operation such that the cell produces the determination signal when the next cell receives the second analog signal.

31 Claims, 13 Drawing Sheets

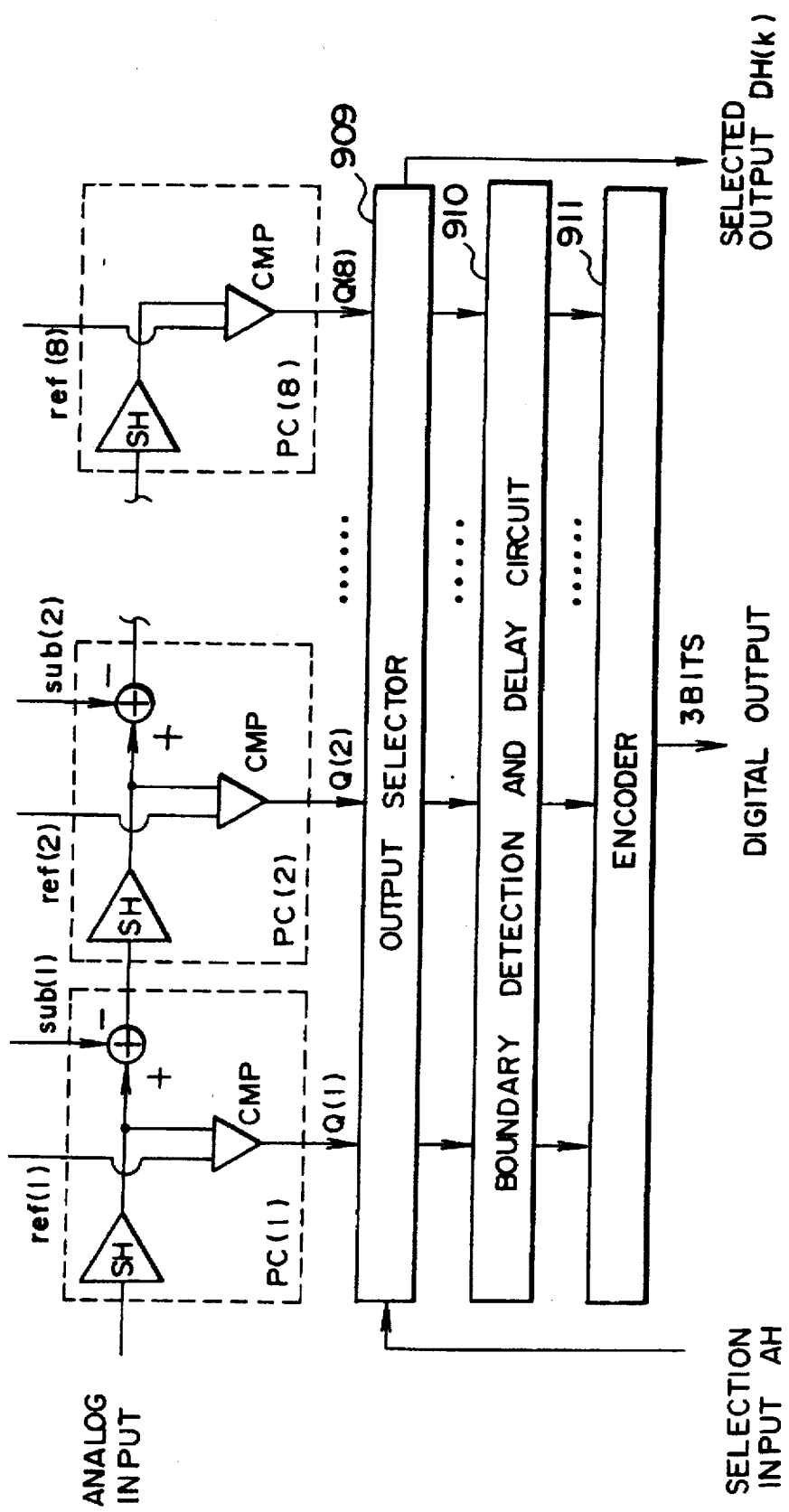

HIGH-SPEED AND LOW-VOLTAGE DRIVEN ANALOG-TO-DIGITAL CONVERTER

BACKGROUND OF THE INVENTION

1. Field of the Invention

The present invention generally relates to analog-to-digital (A/D) converters, and in particular to a circuit arrangement of an A/D converter having a plurality of pipeline cells connected in cascade.

2. Description of the Related Art

With the rapid progress of digital signal processing technology, the need for a high-speed and low-power A/D converter is increasingly growing. Especially, for high-speed digital processing applications, there have been proposed a parallel-type flash A/D converter and a multistage pipelined A/D converter.

An example of the parallel-type flash A/D converter is described in a paper written by Horiba et al. (IEEE Journal of Solid-state Circuits, vol. SC-21, No. 6, pp. 976-982, December 1986). According to the circuit configuration as shown on page 976, the flash A/D converter is comprised of 257 ladder resistors, 256 comparators, a 256-to-8 encoder, output buffers (8bit+overflow), and other necessary circuits. An analog input signal is applied in parallel to all the comparators each comparing the input voltage with each ladder tap voltage. Receiving the outputs of the comparators, the encoder converts them to a digital code.

An example of the multistage pipelined A/D converter is described in a paper written by S. H. Lewis (IEEE Transactions on Circuits and Systems-II: Analog and Digital Signal Processing, vol. 39, No. 8, pp. 516-523, Aug. 1992). According to the circuit configuration as shown on pages 517-518, the N-bit pipelined A/D converter is comprised of N stages each containing a sample-and-hold circuit, a low-resolution A/D subconverter, a low-resolution D/A converter, and a subtracter. Each stage initially samples and holds the analog signal, and then does a low-resolution A/D conversion on the held analog signal. After the produced digital code is converted back into analog form by the D/A converter, the analog output of the D/A converter is subtracted from the held analog signal, producing a residue which is sent to the next stage for further conversion. For instance, the A/D subconverter of the first stage determines whether the MSB (most significant bit) is '1'. If the MSB is '1', an analog signal corresponding to a digital signal comprising the MSB of '1' and other bits of '0' is subtracted from the held analog signal. If the MSB is '0', nothing is subtracted from the held analog signal. Since each stage produces the corresponding bit data at different timing, a delay circuit is necessary to produce an N-bit digital code.

Similar pipelined A/D converters are also described in a paper written by C. A. T. Salama et al. (IEE Proceedings, Vol. 137, Pt. G, No. 2, April 1990) and another paper written by P. G. A. Jespers (IEEE Journal of Solide-state Circuit, Vol. 29, No. 8, August 1994).

However, since the parallel-type flash A/D converter has all the comparators connected in parallel to the analog input, the input capacitance of the A/D converter increases with the number of bits. Therefore, a large number of bits results in the increased signal delay due to the increased input capacitance, causing a problem that a substantial conversion speed is restricted. Further, in cases where a sample-and-hold circuit is provided in an input stage, the sample-and-hold circuit necessitates a large capability to drive all the comparators. Furthermore, since all the comparators concurrently perform the determination of an input signal, it is easy to introduce errors in a digital code due to timing deviations of the clock or variations in output timing between the comparators.

On the other hand, the multistage pipelined A/D converter has several problems as follows. Since analog input voltage levels are not in one-to-one correspondence with quantized determination levels, the linearity of signal transfer characteristic is needed in each stage. However, when the power supply voltage is low, it is difficult to ensure the linearity of signal transfer characteristic. Therefore, it is difficult fro the multistage pipelined A/D converter to operate at a high speed on condition of a low voltage. Furthermore, each stage necessitates a sample-and-hold circuit, one-bit A/D subconverter, one-bit D/A converter, and a subtracter. The delay time of each stage is the sum of a sampling time period, a determination time period of the A/D subconverter, a settling time period of the D/A converter, and a part of a settling time period of the subtracter. Therefore, compared with the parallel-type flash A/D converter, the multistage pipelined A/D converter decreases in throughput due to the processing time of the D/A converter and the subtracter.

SUMMARY OF THE INVENTION

An object of the present invention is to provide a circuit arrangement of an A/D converter having improved throughput.

Another object of the present invention is to provide an A/D converter which can operate at a low voltage with high conversion reliability.

Still another object of the present invention is to provide an A/D converter which operates at a high speed with low power consumption.

A circuit arrangement of an N-bit A/D converter according to the present invention is comprised of $2^N$ cells connected in cascade. The start cell receives an input analog signal, and each cell performs the following determination operation to produce a determination signal. Each cell is comprised of a sample and hold circuit, a comparator, and a subtracter. The sample and hold circuit samples an analog value from a first analog signal received from a previous cell and holds said analog value. The comparator compares the analog value with a reference value to produce the determination signal. The subtracter subtracts a subtrahend value from the analog value to produce a second analog signal which is received by a next cell. The next cell receives the output of the cell as the above-mentioned first analog signal and performs the same determination operation as the cell. The cascade-connected cells are controlled with timing clocks so as to perform a pipeline operation such that the cell produces the determination signal when the next cell receives the second analog signal.

The circuit arrangement is further comprised of a digital circuit which produces determination data based on determination signals which are sequentially produced by the cascade-connected cells, respectively. The determination data comprises the predetermined number of bits associated with the determination signals. Finally, the determination data is converted to an output digital signal corresponding to the input analog signal by an encoder.

The digital circuit for producing the determination data preferably includes a boundary detector and a delay circuit. The boundary detector detects a boundary cell position from the determination signals to produce boundary detection signals by comparing the determination signal produced by the cell with a determination signal produced by an adjacent cell, for instance, the next cell. The delay circuit delays each of the boundary detection signals by a different time period so as to achieve simultaneous output of the boundary detection signals to produce the determination data.

As described above, since each cell concurrently performs the comparison and the subtraction, the time required for processing in each cell is determined depending on which one of the comparison and the subtraction requires a longer processing time. Therefore, compared with the conventional A/D converter, a high-speed conversion is achieved.

Further, since the number of the cascade-connected cells is equal to that of the A/D conversion quantized levels, the predetermined levels of the input analog signal are in one-to-one correspondence with the quantized levels of the comparators of the cells. This causes the A/D converter to be hardly affected by a change in the linearity of signal transfer from a cell to another, achieving a proper A/D conversion with high reliability even in a low voltage.

According to an aspect of the present invention, a circuit arrangement is comprised of a distributing circuit which produces $2^M$ analog signals from the input analog signal and then distribute them to $2^M$ cell lines each comprising $2^N$ cells connected in cascade, respectively. The $2^M$ analog signals consist of the input analog signal and ($2^M-1$) analog signals, wherein the ($2^N-1$) analog signals are produced by subtracting ($2^M-1$) subtrahend signals from the input analog signal, respectively. The ($2^M-1$) subtrahend signals have $2^{N+L}$ times a predetermined determination step, respectively, where L is an integer ranging from 0 to ($2^M-1$).

In the $2^M$ cell lines each comprising $2^N$ cells connected in cascade, a start cell of an i-th (i=1, 2, ..., $2^M$) cell line of the $2^M$ cell lines receives an i-th analog signal of the $2^M$ analog signals, and each of the cells produces a determination signal. The cascade-connected cells are controlled with timing clocks so as to perform a pipeline operation such that the cell produces the determination signal when the next cell receives the second analog signal.

The circuit arrangement is further comprised of $2^M$ processing circuits provided corresponding to the $2^M$ cell lines. An i-th processing circuit produces i-th determination data based on $2^N$ determination signals which are sequentially produced by the cascade-connected cells of an i-th cell line, respectively, wherein the determination data comprises $2^N$ bits associated with the i-th determination signals. The i-th processing circuit converts the i-th determination data to an i-th digital code corresponding to the i-th analog signal, and the i-th processing circuit other than $2^M$-th processing circuit further produce an overflow signal. One of the digital codes produced by the $2^M$ processing circuits is selected according to the overflow signals produced by the 1st to ($2^M-1$)-th processing circuits to produce an (M+N)-bit output digital signal corresponding to the input analog signal.

As described above, since the A/D converter is comprised of $2^M$ cell lines each comprising $2^N$ cascade-connected cells, the input signal range of each cell line becomes $\frac{1}{2^N}$ that of the A/D converter, achieving a low-voltage operation.

According to another aspect of the invention, each of the cells is comprises of the sample and hold circuit, the comparator, the subtracter, and a reset switch for initializing the cell. The circuit is comprised of $2^M$ processing circuits provided corresponding to the $2^M$ cell lines, wherein an i-th processing circuit produces i-th determination data based on $2^N$ determination signals which are sequentially produced by the cascade-connected cells of an i-th cell line, respectively. The determination data comprises $2^N$ bits associated with the i-th determination signals. The i-th processing circuit further converts the i-th determination data to an i-th digital code corresponding to the i-th analog signal. The circuit is further comprised of ($2^N-1$) line selection circuits provided corresponding to second to $2^M$-th cell lines, wherein a j-th (j=2, 3, ..., $2^N$) line selection circuit produces a selection signal and a reset signal based on the determination signal of the start cell of a j-th cell line. The reset signal is output to a second cell of a (j-1)-th cell line to reset the second cell by the reset switch switching on. One of the digital codes produced by the $2^M$ processing circuits is selected according to ($2^N-1$) selection signals produced by the 2nd to $2^M$-th line selection circuits to produce the (M+N)-bit output digital signal corresponding to the input analog signal.

As described above, since each cell has the reset switch which is controlled by the line selection circuit provided in the upper cell line, the cells having no need to operate stop operating. This causes the A/D converter to reduce in power consumption and to avoid malfunctions due to noises of the unused cells.

According to still another aspect of the present invention, the circuit arrangement has a cascade-connected cells, a selector for selecting one of the cells, and a setting circuit for setting the reference value and the subtrahend value to the comparator and the subtracter of each of the cascade-connected cells, respectively.

In the setting circuit, reference values and subtrahend values corresponding to the cells are stored in a memory, and the reference values and subtrahend values are transferred to the corresponding cells, respectively. Further, the setting circuit is comprised of an adjusting circuit which adjusts the reference value and the subtrahend value of a selected cell such that the determination signal of the selected cell coincides with a desired value.

Since such a setting circuit is provided, the reference signal and the subtrahend signal are controlled from outside, achieving accurate A/D conversion even though the characteristics of devices are remarkably changed from device to device due to the low voltage operation.

An A/D converter according to the present invention may be formed with a current-mode circuit. Especially, in cases where the low voltage operation is made, the current-mode circuit has the advantage of having a wide dynamic range.

BRIEF DESCRIPTION OF THE DRAWINGS

FIG. 14 is a circuit diagram showing the A/D converter according to the sixth embodiment.

DETAILED DESCRIPTION OF THE PREFERRED EMBODIMENTS

First Embodiment

Figure 1:
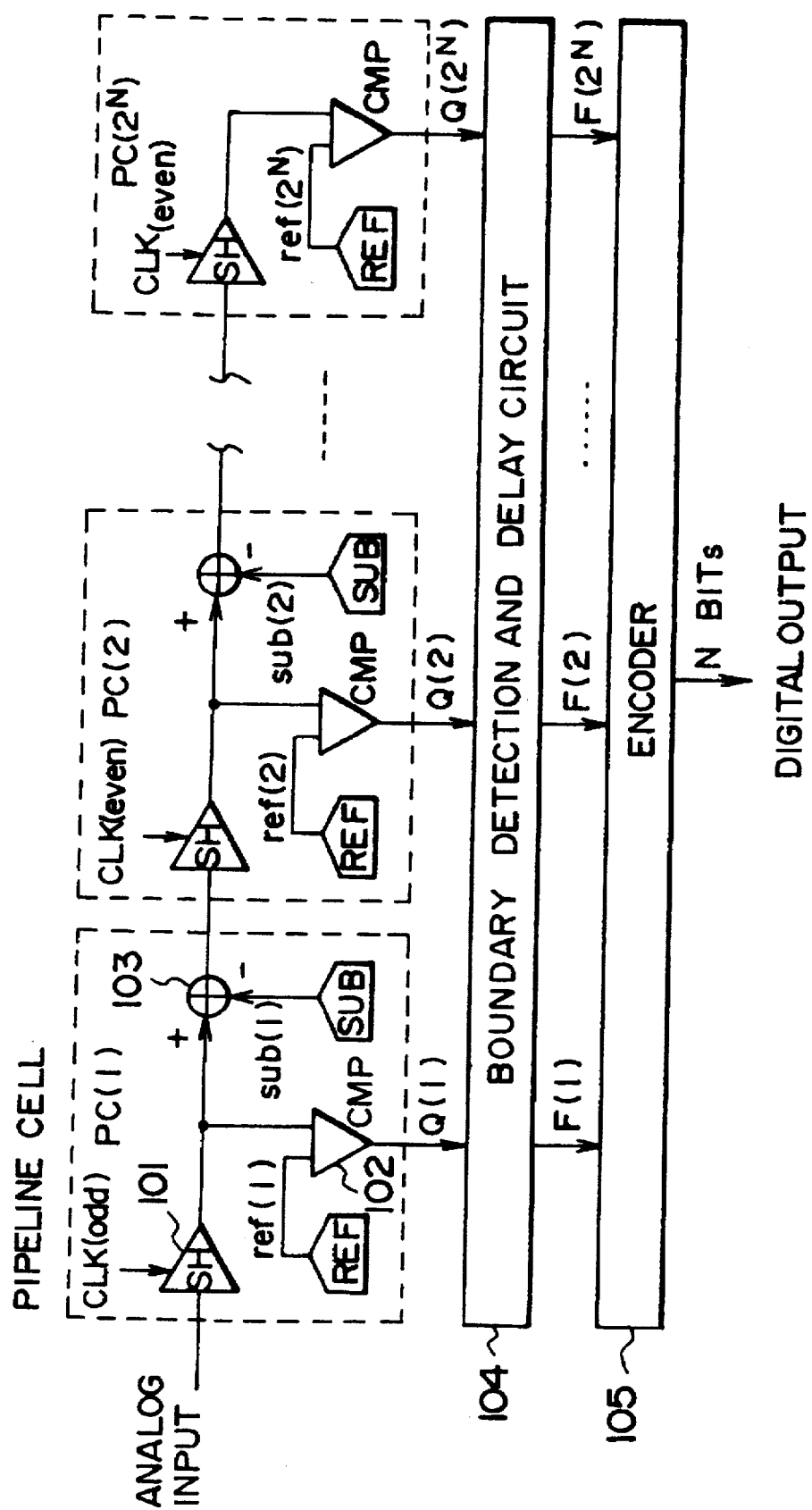
FIG. 1 is a general circuit diagram showing an A/D converter according to a first embodiment of the present invention.

As generally illustrated in FIG. 1, an N-bit A/D converter according to a first embodiment of the present invention converts an analog input signal to an N-bit digital output signal to which one extra bit for overflow may be added. The A/D converter is comprised of $2^N$ pipeline cells PC(1)–PC($2^N$). All pipeline cells other than the last cell PN($2^N$) has the same circuit configuration which contains a sample-and-hold circuit (SH) 101, a comparator (CMP) 102, and a subtracter 103. The last cell PN($2^N$) contains a sample-and-hold circuit (SH) 101 and a comparator (CMP) 102. The A/D converter is further comprised of a boundary-detection and delay circuit 104 and an encoder 105.

Pipeline Cell

In each pipeline cell, the sample-and-hold circuit SH receives an analog signal from the previous stage and performs a sampling and holding operation on the received analog signal in accordance with the predetermined one of complementary clock signals CLK(odd) and CLK(even). The odd cells PC(1), PC(3), . . . perform the sampling and holding operation in accordance with the clock signal CLK(odd), and the even cells PC(2), PC(4), . . . perform the same in accordance with the clock signal CLK(even).

The comparator CMP compares the analog signal produced by the sample-and-hold circuit SH with a reference signal REF. If the analog signal is greater than the reference signal REF, then the comparator CMP outputs a determination signal Q of a logical high value '1' (hereinafter referred to as H-level) to the boundary-detection and delay circuit 104. Otherwise the comparator CMP outputs a determination signal Q of a logical low value '0' (hereinafter referred to as L-level). The analog signal is also output from the sample-and-hold circuit SH to the subtracter which subtracts a subtrahend signal SUB from the analog signal received from the sample-and-hold circuit SH. The subtracter outputs the remainder to the next stage. Needless to say, the last cell PC($2^N$) performs only the comparison of the analog signal received from the previous cell PC($2^N$–1) with the reference signal REF.

Figure 2:
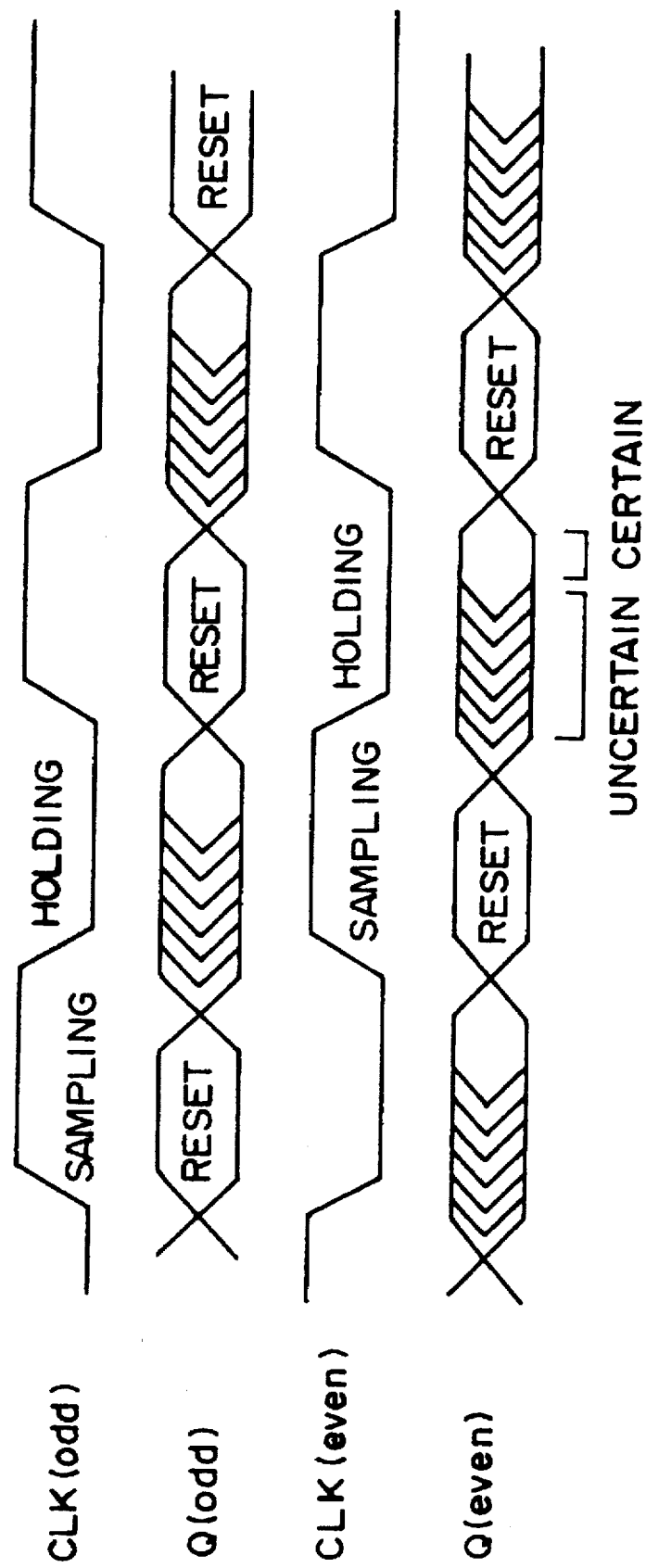
FIG. 2 is a timing chart showing an operation of the S/D converter as shown in FIG. 1.

Referring to FIG. 2, as described above, the clock signal CLK(odd) is supplied in common to the odd cells and the clock signal CLK(even) is supplied in common to the even cells. In this embodiment, the sample-and-hold circuits SHs of the odd cells sample the analog signals from the even cells when the clock signal CLK(odd) is in H-level (sampling phase) and hold the sampled analog signals when in L-level (holding phase). Similarly, the sample-and-hold circuits SHs of the even cells sample the analog signals from the odd cells when the clock signal CLK(even) is in H-level (sampling phase) and hold the sampled analog signals when in L-level (holding phase). The sampling and holding phases are equal in duration. The comparator CMP of each cell compares the held analog signal with the reference signal REF. However, since the output of the subtracter of the previous cell settles after the predetermined settling time, a certain determination signal Q is obtained in the latter half of the holding period. In other words, the minimum duration of the two phases are determined by the maximum settling times of the sample-and-hold circuits SHs.

In this manner, the respective pipeline cells PC(1)–PC($2^N$) produce the certain determination signals Q(1)–Q($2^N$) in the pipeline period of T. The whole determination signals Q(1)–Q($2^N$) represent a so-called thermometer code, that is, a length of consecutive H-level signals starting from the first signal Q(1) like a mercury-in-glass thermometer. The certain determination signals Q(1)–Q($2^N$) are output to the boundary-detection and delay circuit 104 which converts the determination signals Q(1)–Q($2^N$) into boundary detection signals F(1)–F($2^M$) which are then output to the encoder 105.

It should be noted that the reference signal REF and the subtrahend signal SUB are either fixed signals or controlled signals as described later. Each of the pipeline cells operates in either voltage mode or current mode.

Figure 3:
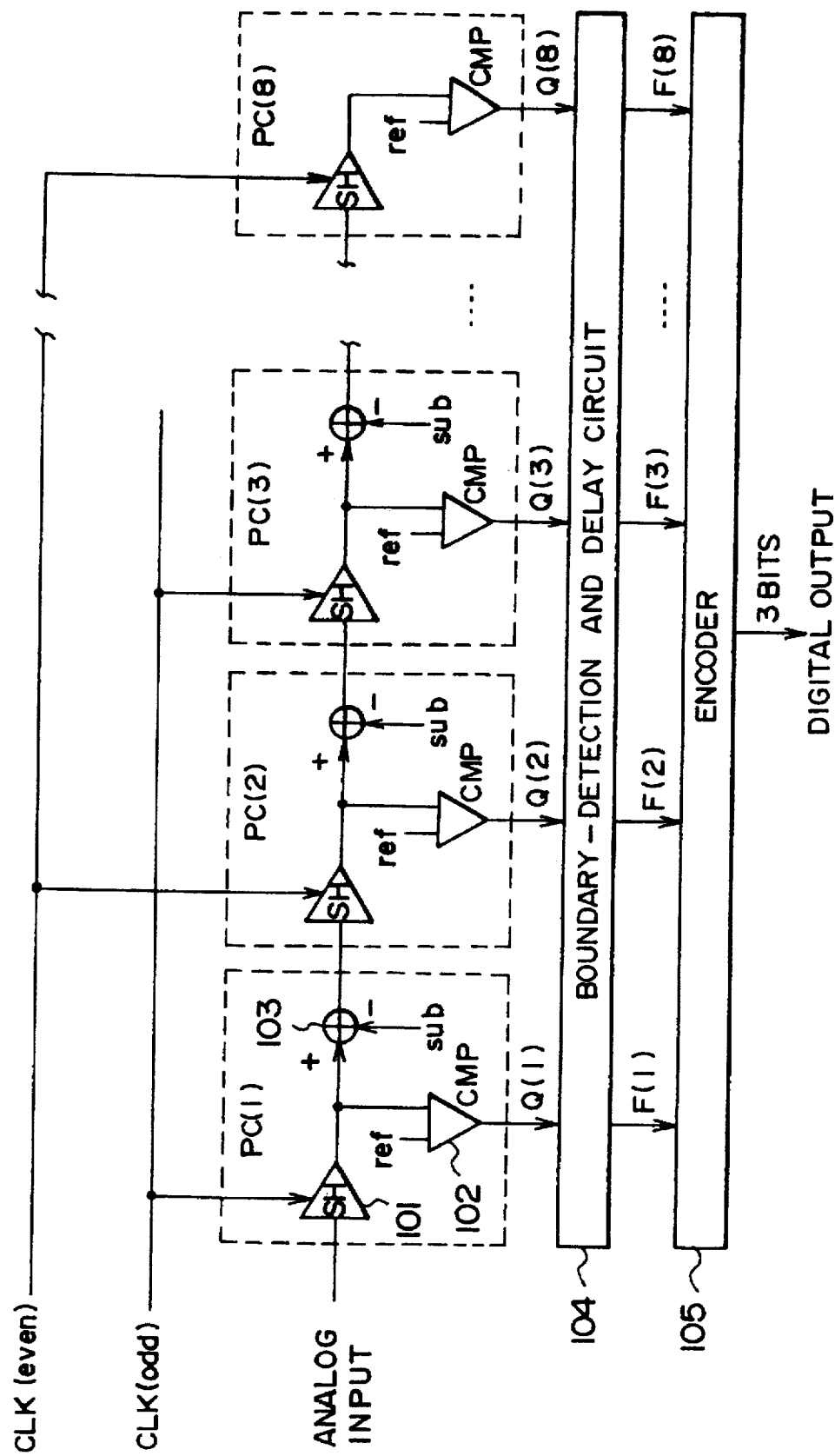
FIG. 3 is a specified circuit diagram showing the first embodiment.

As illustrated in FIG. 3, more specifically, a 3-bit A/D converter according to the first enhodiment has 8 (=$2^3$) pipeline cells PC(1)–PC(8) connected in cascade, wherein the odd cells PC(1), PC(3), PC(5) and PC(7) receive the clock signal CLK(odd) and the even cells PC(2), PC(4), PC(6) and PC(8) receive the clock signal CLK(even). Further, in this 3-bit A/D converter, assuming that the reference signal REF and the subtrahend signal SUB are both set at a level '1' which represents an arbitrary step in voltage or current. Therefore, the resolution of the 3-bit A/D converter is 1 and the full-scale conversion range is 8.

When an analog signal of level '2.3', for instance, is received by the first pipeline cell PC(1), the comparator CMP compares the analog signal (level=2.3) with the reference signal REF (level=1) within the holding phase of the sample-and-hold circuit SH, that is, the L-level period of the clock signal CLK(odd). Since the analog signal is greater than the reference signal REF, the comparator CMP produces a determination signal Q(1) of H-level. At the same time, the subtracter subtracts the subtrahend signal SUB (levels=1) from the analog signal (level=2.3) to output the remainder (level=1.3) to the next cell PC(2).

Similarly, when the analog signal (level=1.3) is received by the second pipeline cell PC(2), the comparator CMP compares the analog signal (level=1.3) with the reference signal REF (level=1) within the holding phase of the sample-and-hold circuit SH, that is, the L-level period of the clock signal CLK(even). Since the analog signal is greater than the reference signal REF, the comparator CMP produces a determination signal Q(2) of H-level. At the same time, the subtracter subtracts the subtrahend signal SUB (level=1) from the analog signal (level=1.3) to output the remainder (levels=0.3) to the next cell PC(3). The same operation is repeated in the following cells PC(3)–PC(8) in accordance with the complementary clock signals CLK (odd) and CLK(even). Since the respective pipeline cells PC(3)–PC(8) receive the analog signals of levels 0.3, –0.7, –1.7, . . . , –4.7, the respective comparators CMPs compare them with the reference signal REF (level=1). Therefore, the respective comparators produce the determination signals Q(1)–Q(8) of 'HHLLLLL' in the pipeline period of T. In most cases, the determination signals Q(1)–Q(8) have a first series of B-levels followed by a second series of L-levels.

Boundary-Detection and Delay Circuit

The boundary-detection and delay circuit 104 is designed to convert the determination signals Q(1)–Q(8) in the pipeline period of T into a certain form suitable for encoding.

Figure 4:
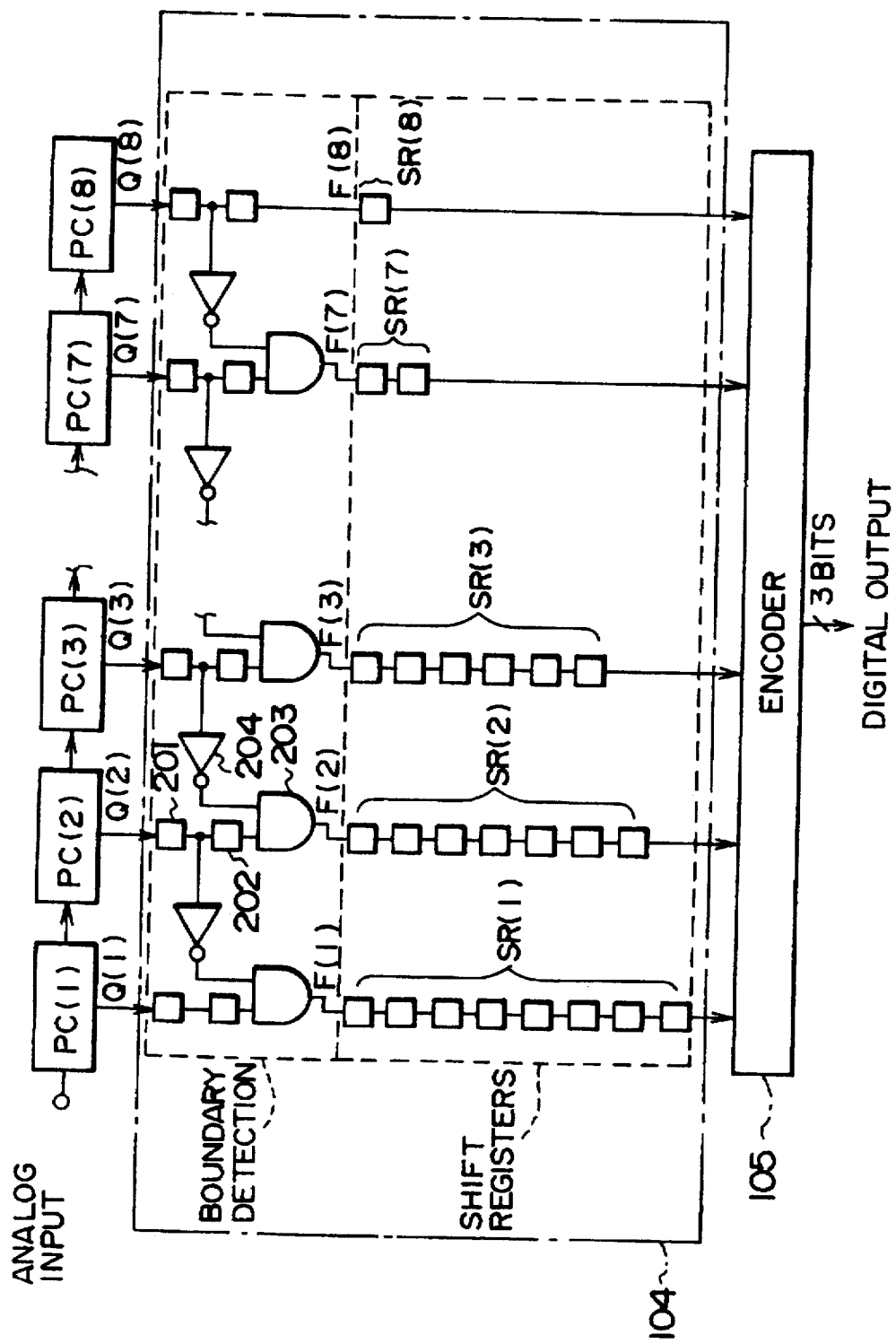
FIG. 4 is a detailed circuit diagram showing boundary detectors and shift registers according to the first embodiment.

Referring to FIG. 4, the boundary-detection and delay circuit 104 is comprised of a boundary detector and eight shift registers SR(1)–SR(8). The boundary detector receives the determination signals Q(1)–Q(8) from the pipeline cells PC(1)–PC(8), respectively, and outputs the respective boundary detection signals F(1)–F(8) to the shift registers SR(1)–SR(8). More specifically, the determination signal Q(i) of a pipeline cell PC(i) is output to a shift resistor comprising two flip-flop circuits 201 and 202 connected in series and then the delayed signal inputs to an AND gate 203. The determination signal Q(i+1) of the next cell PC(i+1) which is delayed by one flip-flop circuit is transferred to the AND gate 203 through an inverter 204. Therefore, the AND gate 203 receives both the determination signal Q(i) and an inverted signal of the determination signal Q(i+1) at the same time. Since the determination signal Q(i+1) is inverted by the inverter 204, the boundary detection signal F(i) goes high only when Q(i) is in H-level and Q(i+1) in L-level.

The respective boundary detection signals F(1)–F(8) are output to the shift registers SR(1)–SR(8) with each signal having a time lag of T behind the corresponding previous signal. The respective shift registers SR(1)–SR(8) delay the boundary detection signals F(1)–F(8) so as to output them to the encoder 105 at the same timing.

Current-Mode Pipeline Cell

The A/D converter may be formed with pipeline cells PC(1)–PC(8) each operating in current mode.

Figure 5:
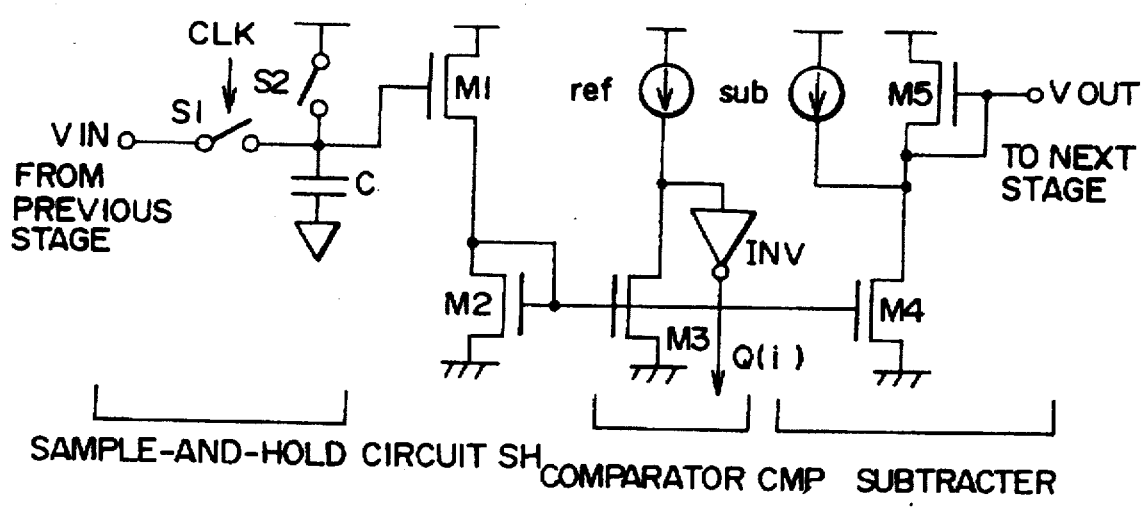
FIG. 5 is a circuit diagram showing another circuit configuration of a pipelined cell according to the first embodiment.

As illustrated in FIG. 5, a sample-and-hold circuit SH is comprised of a sampling switch S1, a normally-off reset switch S2, and a capacitor C for holding a voltage of the analog signal received from the previous stage. The capacitor C becomes charged according to the analog voltage Vin when the sampling switch S1 is on, and holds the analog voltage Vin when the sampling swatch S1 is off. The analog voltage vin of the capacitor C is applied to the gate of a field effect transistor (FET) M1 and thereby a current flows through the FET M1 and an FET M2 connected to the FET M1 in series according to the analog voltage Vin.

A comparator CMP is comprised of an FET M3, a reference current source REF, and an inverter INV. Since the FETs M2 and M3 form a current mirror circuit, the current flows through the FET M3 connected to the reference current source REF in series according to the analog voltage Vin. If the current is larger than the reference current REF, then the comparator CMP outputs a determination signal Q(i) of a logical high value H-level to the boundary-detection and delay circuit 104. Otherwise the comparator CMP outputs a determination signal Q(i) of a logical low value L-level. In order to improve the conversion speed, the comparator CMP may be formed with a high-speed current comparator as disclosed in Japanese Patent Unexamined Publication Nos. 5-243867 and 7-135452.

A subtracter is comprised of an FET M4, an FET M5 connected to the FET M4 in series, and a subtrahend current source SUB which supplies the subtrahend current to the FET M4. Since the FETs M2 and M4 form a current mirror circuit, the current flows through the FET M4 according to the analog voltage Vin. Since the subtrahend current is supplied to the FET M4, the output voltage Vout is reduced by a voltage drop corresponding to the subtrahend current SUB flowing through the FET M4.

Figure 6:
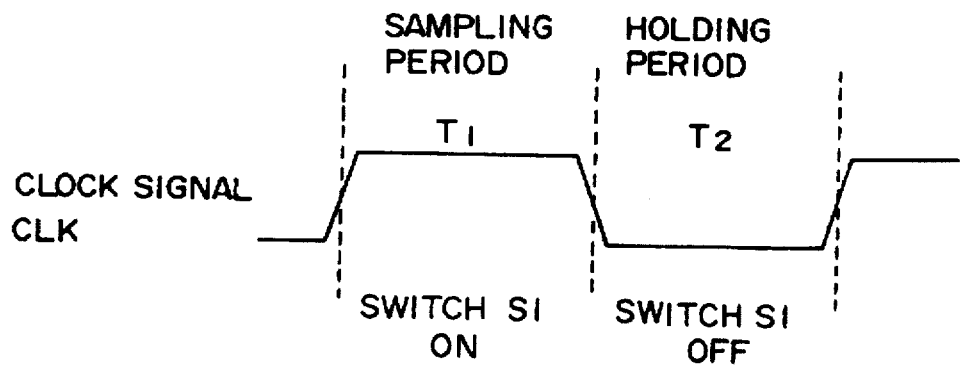
FIG. 6 is a timing chart showing an A/D operation of the pipelined cell as shown in FIG. 5.

Referring to FIG. 6, by switching the sampling switch S1 on and off in accordance with the clock signal CLK, the above-mentioned sampling and holding operation is performed. More specifically, the analog voltage is sampled through the sampling switch S1 during a sampling period $T_1$, and then the analog voltage is held in the capacitor C during a holding period $T_2$. At the same time, the above-mentioned comparison and subtraction are performed by the comparator CMP and the subtracter. When the normally-off reset switch S2 switches on during a holding period, no current flows through the FET M1, causing the pipeline cell to be reset at a predetermined state where the transfer of the analog voltage Vout is shut down.

It is to be noted that the invention is not restricted to the configuration of the current-mode pipeline cell as shown in FIG. 5. For instance, a cascade-type current mirror circuit having a relatively large output resistance may be employed in place of the current major circuit comprising the FETS M2–M4 so as to achieve improved accuracy. Further, the mirror ratio of the current mirror circuit may be changed so as to relax the accuracy required in the comparator and the subtracter.

Second Embodiment

A 3-bit A/D converter according to a second embodiment of the present invention is comprised of two 2-bit A/D converters connected in parallel each having a relatively narrow input range of 0 to $V_1/2$. A combination of the two 2-bit A/D converters connected in parallel provides a relatively wide input range of $V_0$ to $V_0+V_1$, which achieves an A/D converter suitable for low-voltage driving.

Figure 7:
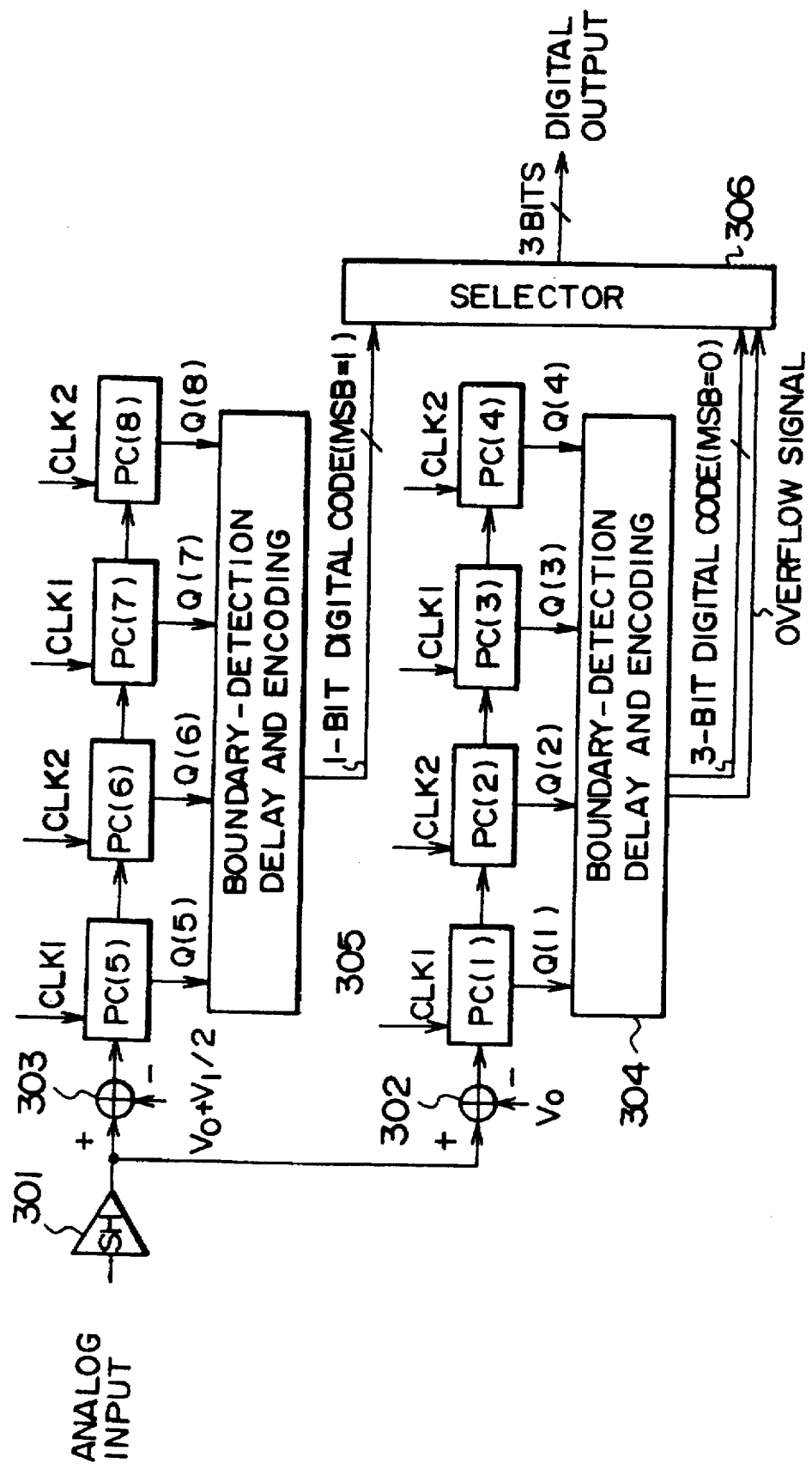
FIG. 7 is a circuit diagram showing an A/D converter according to a second embodiment of the present invention.

Referring to FIG. 7, a sample-and-hold circuit 301 samples and holds an analog signal and outputs the held analog voltage to subtracters 302 and 303. The subtracter 302 subtracts a predetermined voltage $V_0$ from the analog voltage to output the remainder to a first 2-bit A/D converter. The first 2-bit A/D converter is comprised of a first pipeline of cells PC(1)–PC(4) and a lower processing circuit 304 including a boundary-detector, a delay circuit, and an encoder. The first pipeline of cells PC(1)–PC(4) has the same circuit configuration as shown in FIG. 1 when N=2. Similarly, the subtracter 303 subtracts a predetermined voltage $V_0+V_1/2$ from the analog voltage to output the remainder to a second 2-bit A/D converter. The second 2-bit A/D converter is comprised of a second pipeline of cells PC(5)–PC(8) and a upper processing circuit 305 including a boundary detector, a delay circuit, and an encoder. The second pipeline of cells PC(5)–PC(8) has the same circuit configuration as shown in FIG. 1 when N=2.

The determination signals Q(1)–Q(4) are output to the lower processing circuit 304 and the determination signals Q(5)–Q(8) are output to the upper processing circuit 305. The boundary detectors and the delay circuits of the lower and upper processing circuits 304 and 305 have the same circuit configuration as the boundary-detection and delay circuit as shown in FIG. 4. The encoder of the lower processing circuit 304 produces a lower 3-bit digital code as well as a overflow bit, the 3-bit digital code consisting of the most significant bit (MSB) of a logical low value '0' and the two bits produced from the determination signals Q(1)–Q(4). The encoder of the upper processing circuit 305 produces a upper 3-bit digital code consisting of the most significant bit (MSB) of a logical high value '1' and other two bits produced from the determination signals Q(5)–Q(8).

A selector 306 receives the lower 3-bit digital code and the overflow bit from the lower processing circuit 304 and the upper 3-bit digital code from the upper processing circuit 305. The selector 306 selects the lower 3-bit digital code when the overflow bit is low, and selects the upper 3-bit digital code when the overflow bit is high.

Third Embodiment

Figure 8A:
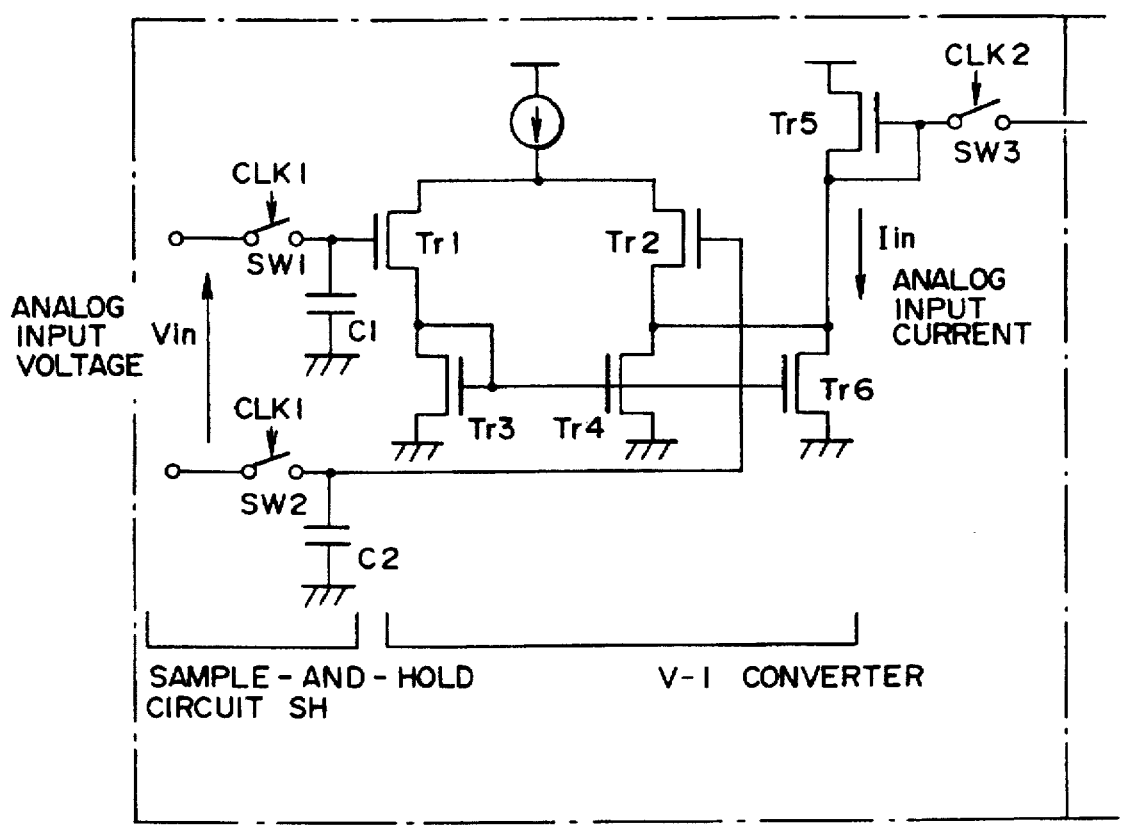
FIG. 8A is a circuit diagram showing an input stage of a current-mode A/D converter according to a third embodiment of the present invention.
Figure 9:
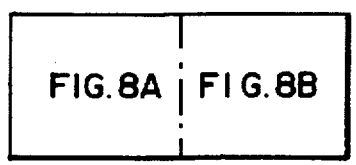
FIG. 9 is a diagram showing a combination of FIGS. 8A and 8B.
Figure 8B:
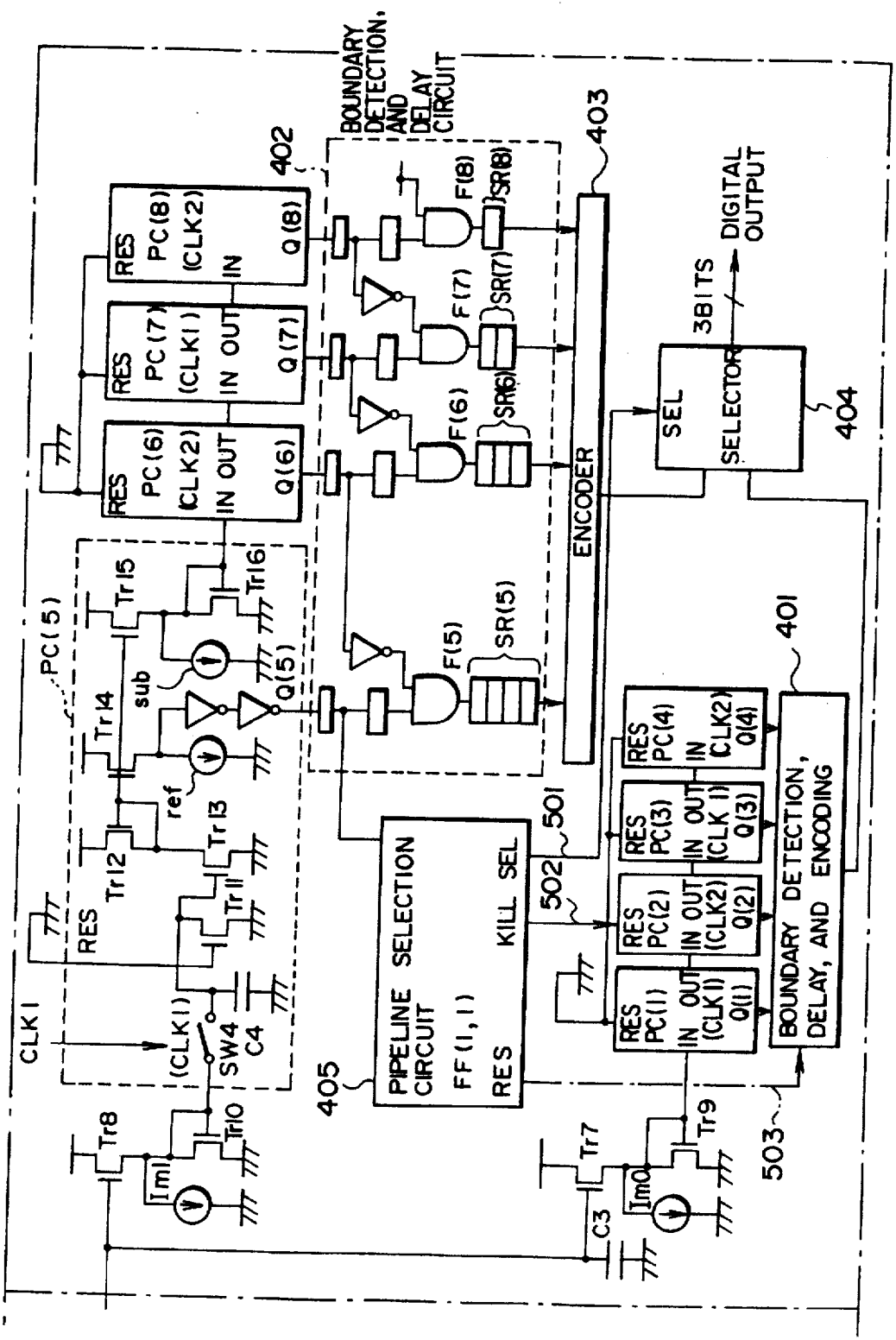
FIG. 8B is a circuit diagram showing the A/D converter of the third embodiment.

Referring to FIGS. 8A and 8B, an analog input voltage Vin is received by a sample-and-hold circuit comprising sampling switches SW1 and SW2 and capacitors C1 and C2. The sampling switches SW1 and SW2 switch on and off according to the clock CLK1 and the input voltage Vin is held in the capacitors C1 and C2 as a voltage difference therebetween. The input voltage Vin retained in the capacitors C1 and C2 is converted into the corresponding current Iin by the voltage-to-current (V-I) converter comprising FETs Tr1–Tr6.

The current Iin is distributed to a upper 2-bit A/D converter and a lower 2-bit A/D converter through a current mirror circuit and upper and lower subtracters. The current mirror circuit is comprised of the FETs Tr5, Tr7 and Tr8 wherein the gate of the FET Tr5 is connected to the gates of the FETs Tr7 and Tr8 through a sampling switch SW3 which are further connected to a capacitor C3 for holding a sampled voltage. The upper and lower subtracters subtract subtrahend currents Im0 and Im1 (Im1>Im0) from the currents flowing through the FETs Tr7 and Tr8 to output the remainders to the upper pipeline of cells PC(5)–PC(8) and the lower pipeline of cells PC(1)–PC(4), respectively.

Each pipeline cell has a current-mode circuit configuration similar to the circuit as shown in FIG. 5. More specifically, the sample-and-hold circuit SH is formed with a sampling switch SW4 and a capacitor C4, and the reset switch is formed with a FET Tr11. The comparator CMP is formed with FETs Tr12–Tr14, a reference current source REF and series-connected inverters, and the subtracter with a subtrahend current source and FETs Tr15 and Tr16.

The lower determination signals Q(1)–Q(4) produced by the lower pipeline of cells PC(1)–PC(4) are output to a processing circuit 401 including a boundary detector, a delay circuit and an encoder. The upper determination signals Q(5)–Q(8) produced by the upper pipeline of cells PC(5)–PC(8) are output to a boundary-detection and delay circuit 402 and then an encoder 403. The processing circuit 401 basically has the same circuit configuration as the combination of the boundary-detection and delay circuit 402 and the encoder 403. The boundary-detection and delay circuit 402 has a circuit configuration similar to the circuit as shown in FIG. 4. The processing circuit 401 outputs a lower 3-bit digital code (MSB=0) to a selector 404 and the encoder 403 outputs a upper 3-bit digital code (MSB=1) to the selector 404.

In this A/D converter, the determination signal produced by the pipeline cell PC(5) is used to decide which digital code is to be selected. More specifically, the determination signal Q(5) delayed by one flip-flop circuit of the boundary-detection and delay circuit 402 is output to a pipeline selection circuit 405. The pipeline selection circuit 405 outputs a SEL signal 501 of H-level to the selector such that the upper 3-bit digital code is selected when the determination signal Q(5) is in H-level, and outputs the SEL signal 501 of L-level to the selector such that the lower 3-bit digital code is selected when the determination signal Q(5) is in L-level. In addition, when the determination signal Q(5) is in H-level, the pipeline selection circuit 405 outputs a KILL signal 502 to the pipeline cell PC(2) so as to reset the cell PC(2) as well as the following cells. This causes the power consumption of the A/D converter to be reduced.

It is possible to employ another circuit configuration such that an OR circuit is provided in place of the selector 404. When the determination signal Q(5) is in H-level, the pipeline selection circuit 405 outputs a reset signal 503 to a first flip-flop circuit receiving the determination signal Q(1) so as to reset the first flip-flop circuit. This causes the determination signal Q(1) to be invalidated, and thus the lower 2-bit A/D converter outputs the lower 3-bit digital code '000' to the OR circuit. Therefore, the OR circuit produces the upper 3-bit digital code as a digital output of the A/D converter.

Fourth Embodiment

An 8-bit A/D converter according to a fourth embodiment is comprised of 4 current-mode 6-bit A/D converters connected in parallel each 6-bit A/D converter having 64 pipeline cells. Each pipeline cell corresponds to one input range level of an input analog signal ranging from 0 to 256.

Figure 10:
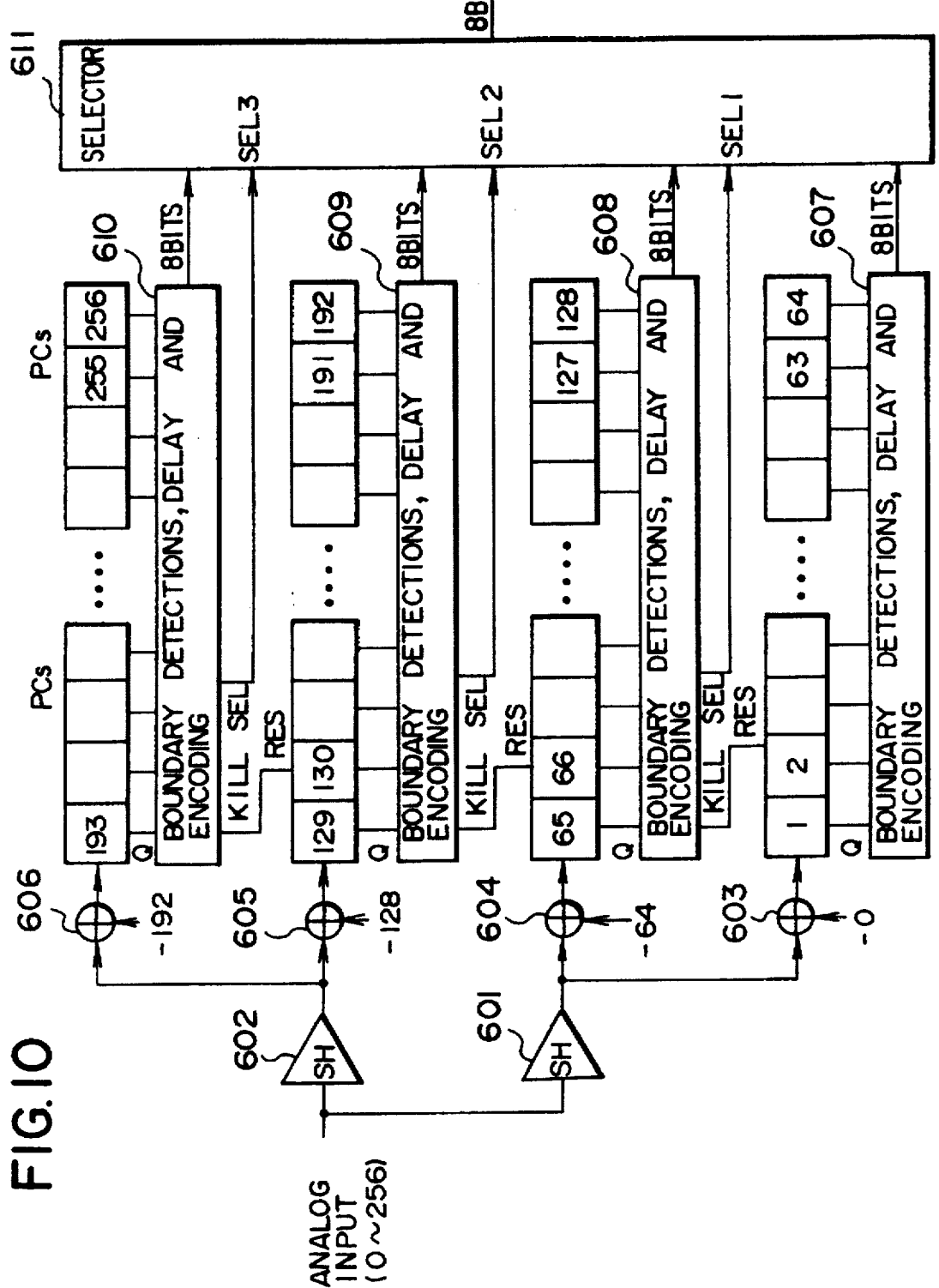
FIG. 10 is a general circuit diagram showing an A/D converter according to a fourth embodiment of the present invention.

Referring to FIG. 10, sample-and-hold circuits 601 and 601 sample and hold an input analog signal, and then the sample-and-hold circuit 601 outputs the analog signal to subtracters 603 and 604 and the sample-and-hold circuit 602 outputs the analog signal to subtracters 605 and 606. The subtracter 603 transfers the analog signal to the first pipeline of cells PC(1)–PC(64) with subtracting nothing from the analog signal received from the sample-and-hold circuit 601. The subtracter 604 subtracts a subtrahend signal of 64 levels from the analog signal received from the sample-and-hold circuit 601 and outputs the remainder to the second pipeline of cells PC(65)–PC(128). The subtracter 605 subtracts a subtrahend signal of 128 levels from the analog signal received from the sample-and-hold circuit 602 and outputs the remainder to the third pipeline of cells PC(129)–PC(192). The subtracter 606 subtracts a subtrahend signal of 192 levels from the analog signal received from the sample-and-hold circuit 602 and outputs the remainder to the fourth pipeline of cells PC(193)–PC(256).

The respective determination signals Q(1)–Q(64) of the first pipeline of cells PC(1)–PC(64) are output to a processing circuit 607 including a boundary detector, a delay circuit and an encoder. The respective determination signals Q(65)–Q(128) of the second pipeline of cells PC(65)–PC(128) are output to a processing circuit 608 including a boundary detector, a delay circuit, an encoder and a pipeline selection circuit. The respective determination signals Q(129)–Q(192) of the third pipeline of cells PC(129)–PC(192) are output to a processing circuit 609 including a boundary detector, a delay circuit, an encoder and a pipeline selection circuit. The respective determination signals Q(193)–Q(256) of the fourth pipeline of cells PC(193)–PC(256) are output to a processing circuit 610 including a boundary detector, a delay circuit, an encoder and a pipeline selection circuit.

The processing circuits 608–610 have the circuit configuration similar to the boundary-detection and delay circuit 402, the encoder 403 and the pipeline selection circuit 405 as shown in FIG. 8B. The pipeline selection circuit of the processing circuit 608 outputs a KILL signal to the pipeline cell PC(2) of the first pipeline and a SEL signal SEL1 to a selector 611. The pipeline selection circuit of the processing circuit 609 outputs a KILL signal to the pipeline cell PC(66) of the second pipeline and a SEL signal SEL2 to the selector 611. The pipeline selection circuit of the processing circuit 610 outputs a KILL signal to the pipeline cell PC(130) of the third pipeline and a SEL signal SEL3 to the selector 611.

In addition, the respective encoders of the processing circuits 607-610 outputs 8-bit digital codes including most significant two bits preset at '00', '01', '10', and '11'. The selector 611 selects one of 8-bit digital codes produced by the processing circuits 607-610 according to the SEL signals SEL1-SEL3 received from the processing circuits 608-610 as described above.

In this embodiment, since a plurality of sample-and-hold circuits are provided to share the load, one sample-and-hold circuit is burdened with a relatively light load, resulting in improved throughput.

In general, an (M+N)-bit A/D converter according to the second to fourth embodiments can be formed with $2^M$ pipelines each comprising $2^N$ cells.

Fifth Embodiment

Figure 11:
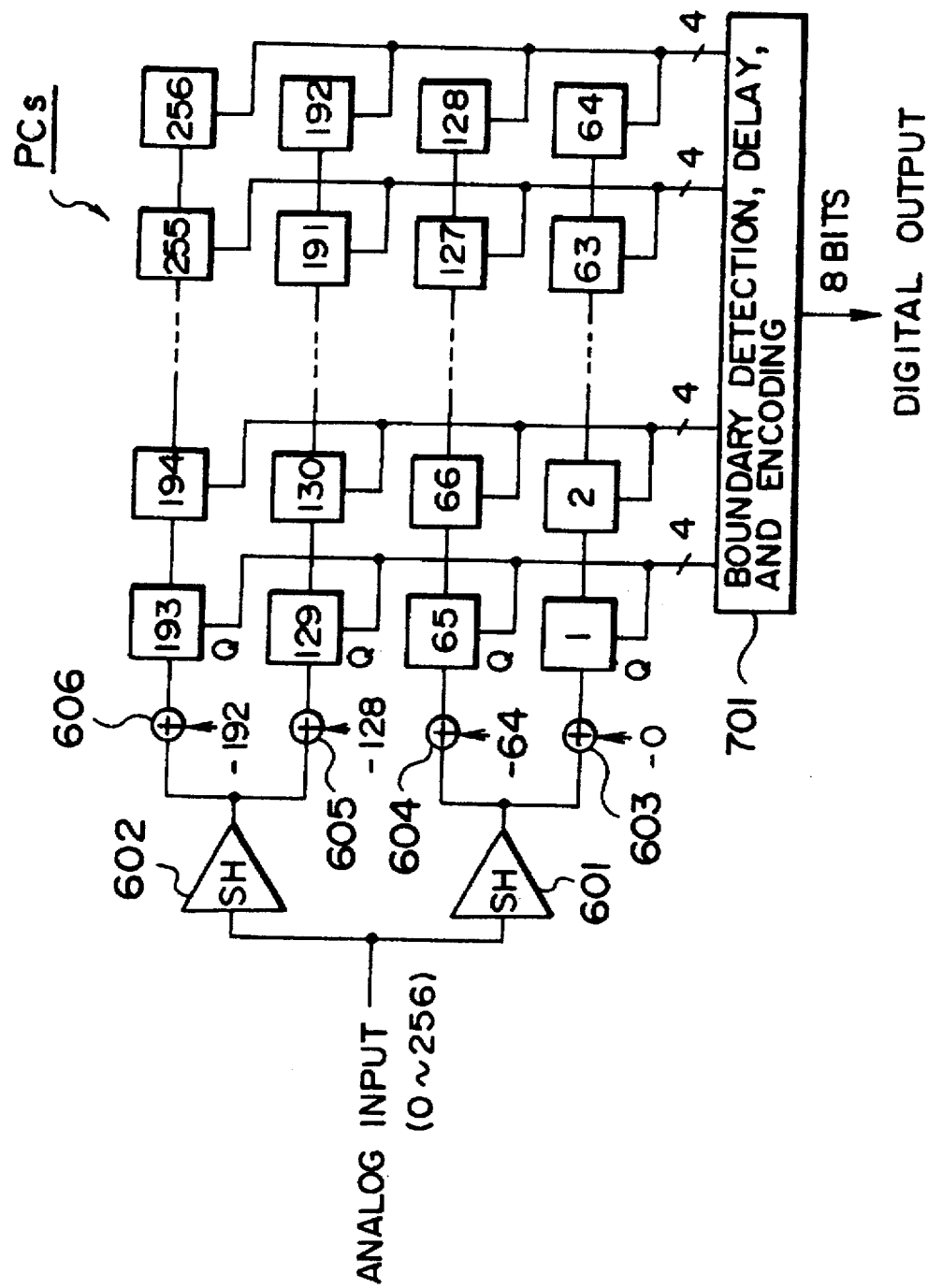
FIG. 11 is a general circuit diagram showing an A/D converter according to a fifth embodiment of the present invention.

Referring to FIG. 11, circuit blocks similar to those previously described with reference to FIG. 10 are denoted by the same reference numerals. A total of 256 cells are arranged in a matrix to form four pipelines of cells: PC(1) –PC(64), PC(65)–PC(128), PC(129)–PC(192), and PC(193) –PC(256). Four determination signals Q(i), Q(i+64), Q(i+128) and Q(i+192) in each column are output to a processing circuit 701. The processing circuit 701 decides which pipeline is valid according to the determination signal Q of a predetermined cell of each pipeline and the determination signals of the valid pipeline are used to produce an 8-bit digital code. Note that the embodiment is provided with pipeline cell reset circuits (not shown) as described in FIG. 8B.

Figure 12:
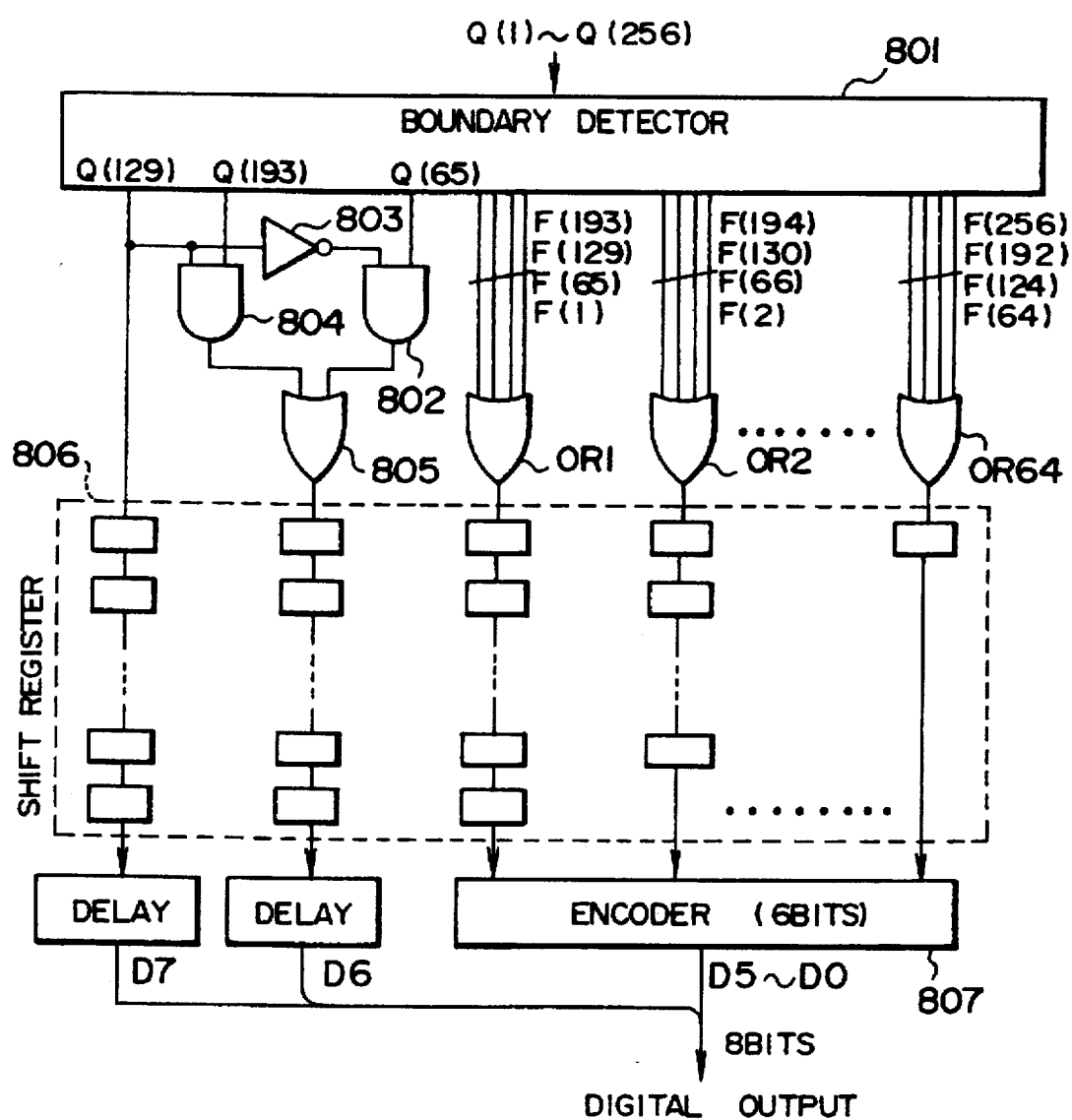
FIG. 12 is a specified circuit diagram showing a boundary detection, delay, and encoding circuit of the A/D converter as shown in FIG. 11.

As shown in FIG. 12, the processing circuit 701 is comprised of a boundary detector 801 which receives the determination signals Q(1)–Q(256) from the 4 pipelines and produces boundary detection signals F(1)–F(256), as described before. In this embodiment, the processing circuit 701 uses the determination signals Q(65), Q(129) and Q(193) of the first cells PC(65), PC(129) and PC(193) to decide the valid pipeline.

An AND gate 802 receives the determination signal Q(65) and the output of an inverter 803 receiving the determination signal Q(129). An AND gate 804 receives the determination signals Q(129) and Q(193). The outputs of the AND gates 802 and 804 are output to an OR gate 805. After passing through a shift register 806 and delay circuits for adjusting delay time, the determination signal Q(129) and the output of the OR gate 805 are used as the upper two bits D7 and D6 of an 8-bit digital code.

A set of boundary detection signals F(i), F(i+64), F(i+128) and F(i+192) in each column are output from the boundary detector 801 to an OR gate ORi, where i=1, 2, . . ., 64. The outputs of the OR gates OR1-OR64 are transferred to an encoder 807 through a shift register 806 for adjusting delay time. The encoder 807 encodes the outputs of the OR gates OR1–OR64 to produce the lower five bits D5–D0 of the 8-bit digital code.

As described above, according to the embodiment, the hardware amount of processing circuits is about one quarter smaller than the arrangement as shown in FIG. 10.

Sixth Embodiment

An 3-bit A/D converter according to a sixth embodiment of the present invention is provided with a correction circuit which supplies the reference signals REFs and the subtrahend signals SUBS to the pipeline cells as shown in FIG. 1 to correct the A/D conversion characteristics. For simplicity, a processor for performing the correction operation is not shown in this figure.

Figure 13:
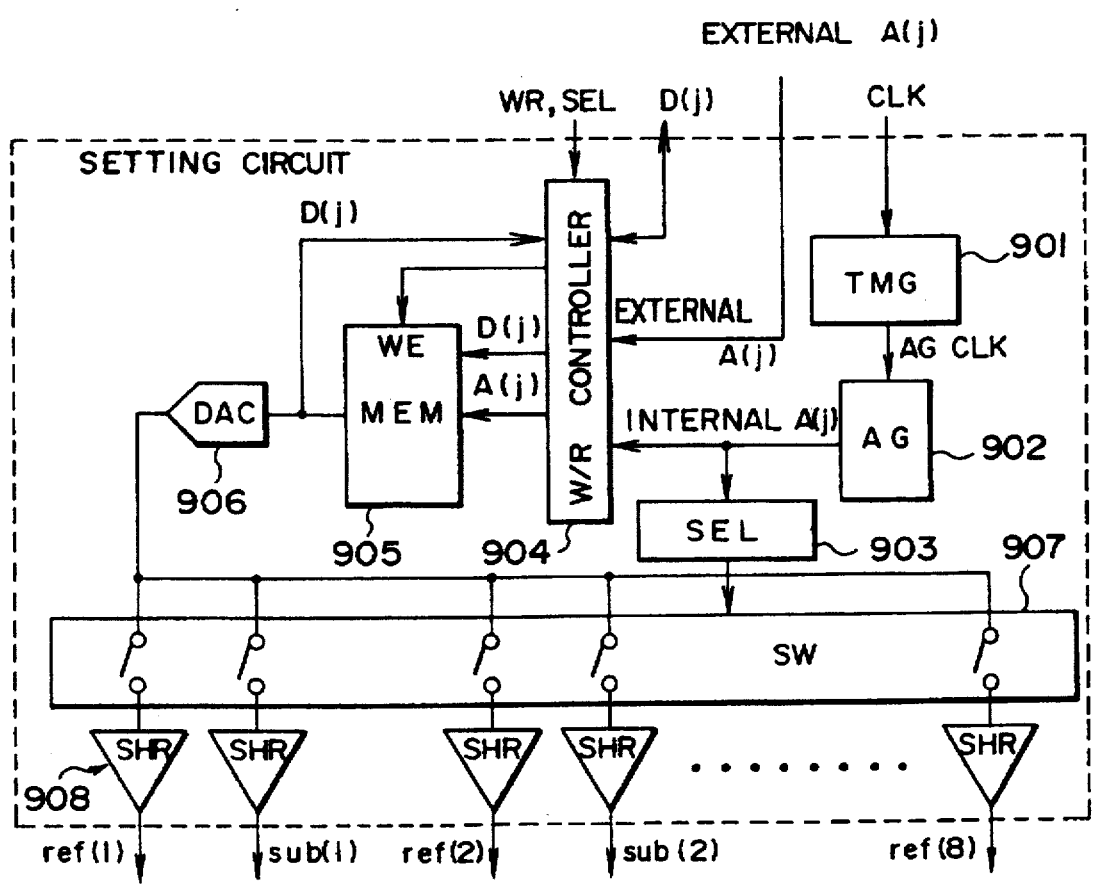
FIG. 13 is a circuit diagram showing a cell adjustment circuit of an A/D converter according to a sixth embodiment of the present invention.

Referring to FIG. 13, a timing generator 901, receiving a clock signal CLK from the processor, supplies timing clock signals to other circuits including an address generator 902. According to an address generation clock signal AGCLK received from the timing generator 901, the address generator 902 generates an internal address A(j) which is cyclic within a predetermined address range. The internal address A(j) is output to a selector 903 and a read/write controller 904.

The read/write controller 904 selects one of the internal address A(j) and an external address A(j) according to a selection signal SEL received from the processor and then outputs a selected address A(j) to a setting data memory 905. According to the address A(j) and a W/R control signal received from the processor, the read/write controller 904 controls the setting data memory 905 such that the setting data D(j) at the address A(j) is read out from the setting data memory 905 and that new setting data D(j) received from the host processor is written at the address A(j) of the setting data memory 905. The setting data memory 905 stores reference data REF(k) and subtrahend data SUB(k) at the addresses A(j) and A(j+1), respectively. The setting data read out from the setting data memory 905 is converted into analog by a digital-to-analog converter (DAC) 906, and then the analog setting data is transferred to one of sample-and-hold (SH) circuits 908 through a switch circuit 907. The switch circuit is comprised of 8 switches each connected to the corresponding SH circuit 908 and controlled by the selector 903. The selector 903 switches on one of the switches according to the internal address A(j) to transfer the analog setting data, REF(k) or SUB(k), from the DAC 906 to the corresponding SH circuit 908 in which the analog setting data is retained and output to the corresponding pipeline cell PC(k), where k=1, 2, . . . , 8. In this embodiment, since the selector 903 causes one of the switches to sequentially switch on according to the cyclic internal address A(j), the SH circuits 908 are refreshed at predetermined intervals to keep the retained analog data constant.

Referring to FIG. 14, the 3-bit A/D converter is further comprised of an output selector 909 which selects one signal Q(k) from the determination signals Q(1)–Q(8) according to a selection signal AH. The output DH(k) corresponding to the selected determination signal Q(k) is output from the output selector 909 to the processor which adjusts the setting data stored in the setting data memory 905 each that the selected output DH(k) coincides with a desired value.

Consider the case where the processor performs the setting data correction for a pipeline cell PC(k). The processor outputs the selection signal AH to the output selector 909, and thereby the output selector 909 is set to select the output Q(k). After writing REF(k) and SUB(k) as test data onto the setting data memory 905 according to an external address A(j), the read/write controller 904 reads the test data from the setting data memory 905 and outputs the analog REF(k) and SUB(k) to the corresponding SH circuits through the selected switches, respectively. Therefore, the analog REF(k) and SUB(k) are supplied to the comparator CMP and the subtracter of the pipeline cell PC(k), respectively. The determination signal Q(k) is produced by the comparator CMP and is output to the output selector 909 which outputs a selected output DH(k) to the processor. The processor checks whether the selected output DH(k) coincides with a desired value. If the selected output DH(k) does not coincide with the desired value, corrected REF(k) and SUB(k) data are written onto the setting data memory 905 and supplied to the pipeline cell PC(k) again. The processor repeats such a data correction operation until the selected output DH(k) coincides with the desired value.

In this manner, this data correction operation is repeatedly performed on all the pipeline cells PC(1)–PC(8), resulting in the corrected conversion characteristics of the A/D converter.

Needless to say, the processor may be provided in the outside or inside of the A/D converter. Further a first memory for REF data and a second memory for SUB data may be provided in place of the setting data memory 905.

It should be noted that each pipeline cell may be provided with an amplifier for amplifying an analog signal received from the previous stage. Further, it is possible to combine pipeline cells more than the number of the quantized levels so as to provide redundancy with the A/D converter, which results in improved reliability of the A/D conversion. Furthermore, since each pipeline cell is optimized by adjusting REF and SUB data, there is no need to use all the pipeline cells each having been adjusted strictly.

What is claimed is:

1. An analog-to-digital converter circuit comprising:
    a predetermined number of cells connected in cascade, a start cell receiving an input analog signal, and each of said cells producing a determination signal, each of said cells comprising:
        a sample and hold circuit for sampling an analog value from a first analog signal received from a previous cell and holding said analog value;
        a comparator for comparing said analog value with a reference value to produce said determination signal; and
        a subtracter for subtracting a subtrahend value from said analog value to produce a second analog signal which is received as said first analog signal by a next cell following said cell;
    control means for controlling said cells such that said cell produces said determination signal when said next cell receives said second analog signal as said first analog signal;
    first means for producing determination data based on determination signals which are sequentially produced by said cells, respectively, said determination data comprising a predetermined number of bits associated with said determination signals; and
    second means for converting said determination data to an output digital signal corresponding to said input analog signal.

2. The circuit according to claim 1, wherein said first means comprises:
    detecting means for detecting a boundary cell position from said determination signals to produce boundary detection signals by comparing said determination signal produced by said cell with a determination signal produced by an adjacent cell; and
    delay means for delaying each of said boundary detection signals by a different time period so as to produce said determination data.

3. The circuit according to claim 2, wherein said delay means comprises said predetermined number of shift registers each having a different number of delay elements.

4. The circuit according to claim 1, wherein said cells operate in voltage mode.

5. The circuit according to claim 1, wherein said cells operate in current mode.

6. The circuit according to claim 1, further comprising:
    setting means for setting said reference value and said subtrahend value to said comparator and said subtracter of each of said cells, respectively, said setting means comprising:
        memory means for storing reference values and subtrahend values corresponding to said cells; and
        transfer means for transferring said reference values and subtrahend values to said cells.

7. A circuit for converting an input analog signal to a N-bit output digital signal including one overflow bit, comprising:
    $2^{N-1}$ cells connected in cascade, a start cell receiving said input analog signal, and each of said cells producing a determination signal,
    each of said cells comprising:
        a sample and hold circuit for sampling an analog value from a first analog signal received from a previous cell and holding said analog value;
        a comparator for comparing said analog value with a reference value to produce said determination signal; and
        a subtracter for subtracting a subtrahend value from said analog value to produce a second analog signal which is received as said first analog signal by a next cell following said cell;
    control means for controlling said cells such that said cell produces said determination signal when said next cell receives said second analog signal as said first analog signal;
    first means for producing determination data based on $2^{N-1}$ determination signals which are sequentially produced by said cells, respectively, said determination data comprising $2^{N-1}$ bits associated with said determination signals; and
    second means for converting said determination data to said N-bit output digital signal corresponding to said input analog signal.

8. The circuit according to claim 7, wherein said first means comprises:
    detecting means for detecting a boundary cell position from said determination signals to produce boundary detection signals by comparing said determination signal produced by said cell with a determination signal produced by an adjacent cell; and
    delay means for delaying each of said boundary detection signals by a different time period so as to produce said determination data.

9. The circuit according to claim 8, wherein said delay means comprises $2^{N-1}$ shift registers each having a different number of delay elements.

10. The circuit according to claim 7, wherein said cells operate in voltage mode.

11. The circuit according to claim 7, wherein said cells operate in current mode.

12. The circuit according to claim 7, further comprising:
    setting means for setting said reference value and said subtrahend value to said comparator and said subtracter of each of said cells, respectively, said setting means comprising:
        memory means for storing reference values and subtrahend values corresponding to said cells; and
        transfer means for transferring said reference values and subtrahend values to said cells.

13. A circuit for converting an input analog signal to a (M+N)-bit digital signal, where M and N both are an integer, said circuit comprising:

first means for producing $2^M$ analog signals from said input analog signal, said $2^M$ analog signals consisting of said input analog signal and ($2^M-1$) analog signals, said ($2^M-1$) analog signals being produced by subtracting ($2^M-1$) subtrahend signals from said input analog signal, respectively, said ($2^{M-1}$) subtrahend signals having $2^{N+L}$ times a predetermined determination step, respectively, where L is an integer ranging from 0 to ($2^M-1$);

$2^M$ cell lines each comprising $2^N$ cells connected in cascade, a start cell of an i-th (i=1, 2, . . . , $2^M$) cell line of said $2^M$ cell lines receiving an i-th analog signal of said $2^N$ analog signals, and each of said cells producing a determination signal, each of said cells comprising:
  a sample and hold circuit for sampling an analog value from a first analog signal received from a previous cell and holding said analog value;
  a comparator for comparing said analog value with a reference value to produce said determination signal; and
  a subtracter for subtracting a subtrahend value from said analog value to produce a second analog signal which is received as said first analog signal by a next cell following said cell;

control means for controlling each of said cell lines such that said cell produces said determination signal when said next cell receives said second analog signal as said first analog signal;

$2^M$ processing circuits provided corresponding to said $2^M$ cell lines, an i-th processing circuit of said $2^M$ processing circuits producing i-th determination data based on $2^M$ determination signals which are sequentially produced by said cells of an i-th cell line of said cell lines, respectively, said determination data comprising $2^M$ bits associated with said i-th determination signals, said i-th processing circuit converting said i-th determination data to an i-th digital code corresponding to said i-th analog signal, and said i-th processing circuit other than $2^M$-th processing circuit further producing an overflow signal; and selecting means for selecting one of said digital codes produced by said $2^M$ processing circuits according to said overflow signals produced by said first to ($2^M-1$)-th processing circuits to produce said (M+N)-bit output digital signal corresponding to said input analog signal.

14. The circuit according to claim 13, wherein said i-th processing circuit produces said i-th digital code having most significant M bits preset at a binary code of an integer number (i-1).

15. The circuit according to claim 13, wherein said i-th processing circuit comprises:
  detecting means for detecting a boundary cell position from said $2^M$ determination signals which are sequentially produced by said cells of an i-th cell line of said cell lines, respectively, to produce boundary detection signals by comparing said determination signal produced by said cell with a determination signal produced by an adjacent cell; and
  delay means for delaying each of said boundary detection signals by a different time period so as to produce said determination data.

16. The circuit according to claim 13, wherein said cells operate in voltage mode.

17. The circuit according to claim 13, wherein said cells operate in current mode.

18. The circuit according to claim 13, wherein said first means comprises:
  $2^{M-1}$ sample and hold circuits each for sampling an input analog value from said input analog signal and holding said input analog value; and
  $2^M$ subtrahend connected to said $2^M$ cell lines, respectively, and two subtracters receiving said input analog value from a single sample and hold circuit of said $2^{N-1}$ sample and hold circuits, said $2^M$ subtracters producing $2^M$ analog values from said input analog value, respectively, said $2^M$ analog values consisting of said input analog value and ($2^M-1$) analog values, said ($2^M-1$) analog values being produced by subtracting ($2^M-1$) subtrahend values from said input analog values, respectively, said ($2^M-1$) subtrahend values having $2^{M+L}$ times a predetermined determination step, respectively, where L is an integer ranging from 0 to ($2^{M-1}$).

19. The circuit according to claim 13, further comprising:
  setting means for setting said reference value and said subtrahend value to said comparator and said subtracter of each of said cells, respectively, said setting means comprising:
    memory means for storing reference values and subtrahend values corresponding to said cells; and
    transfer means for transferring said reference values and subtrahend values to said cells.

20. A circuit for converting an input analog signal to a (M+N)-bit digital signal, where M and N both are an integer, said circuit comprising
  first means for producing $2^M$ analog signals from said input analog signal, said $2^M$ analog signals consisting of said input analog signal and ($2^M-1$) analog signals, said ($2^M-1$) analog signals being produced by subtracting ($2^M-1$) subtrahend signals from said input analog signal, respectively, said ($2^M-1$) subtrahend signals having $2^{M+L}$ times a predetermined determination step, respectively, where L is an integer ranging from 0 to ($2^N-1$);

$2^M$ cell lines each comprising $2^N$ cells connected in cascade, a start cell of an i-th (i=1, 2, . . . , $2^M$) cell line of said $2^N$ cell lines receiving an i-th analog signal of said $2^M$ analog signals, and each of said cells producing a determination signal, each of said cells comprising:
    a sample and hold circuit for sampling an analog value from a first analog signal received from a previous cell and holding said analog value;
    a comparator for comparing said analog value with a reference value to produce said determination signal;
    a subtracter for subtracting a subtrahend value from said analog value to produce a second analog signal which is received as said first analog signal by a next cell following said cell; and
    a reset swatch for initializing said determination signal and said second analog signal;

control means for controlling each of said cell lines such that said cell produces said determination signal when said next cell receives said second analog signal as said first analog signal;

$2^M$ processing circuits provided corresponding to said $2^M$ cell lines, an i-th processing circuit of said $2^M$ processing circuits producing i-th determination data based on $2^N$ determination signals which are sequentially produced by said cells of an i-th cell line of said cell lines, respectively, said determination data comprising $2^N$ bits associated with said i-th determination signals, and said i-th processing circuit converting said i-th determination data to an i-th digital code corresponding to said i-th analog signal;

($2^M$–1) line selection circuits provided corresponding to second to $2^M$-th cell lines, a j-th (j=2, 3, . . . , $2^M$) line selection circuit producing a selection signal and a reset signal based on said determination signal of said start cell of a j-th cell line, said reset signal being output to a second cell of a (j–1)-th cell line to reset said second cell by said reset switch switching on;

selecting means for selecting one of said digital codes produced by said $2^M$ processing circuits according to ($2^{M-1}$) selection signals produced by said second to $2^M$-th line selection circuits to produce said (M+N)-bit output digital signal corresponding to said input analog signal.

21. The circuit according to claim 20, wherein said i-th processing circuit comprises:

detecting means for detecting a boundary cell position from said $2^N$ determination signals which are sequentially produced by said cells of an i-th cell line of said cell lines, respectively, to produce boundary detection signals by comparing said determination signal produced by said cell with a determination signal produced by an adjacent cell; and delay means for delaying each of said boundary detection signals by a different time period so as to produce said determination data.

22. The circuit according to claim 20, wherein said cells operate in voltage mode.

23. The circuit according to claim 20, wherein said cells operate in current mode.

24. The circuit according to claim 20, wherein said first means comprises:

$2^{M-1}$ sample and hold circuits each for sampling an input analog value from said input analog signal and holding said input analog value; and $2^M$ subtracters connected to said $2^M$ cell lines, respectively, and two subtracters receiving said input analog value from a single sample and hold circuit of said $2^{M-1}$ sample and hold circuits, said $2^N$ subtracters producing $2^M$ analog values from said input analog value, respectively, said $2^M$ analog values consisting of said input analog value and ($2^M$–1) analog values, said ($2^M$–1) analog values being produced by subtracting ($2^M$–1) subtrahend values from said input analog values, respectively, said ($2^M$–1) subtrahend values having $2^{N+L}$ times a predetermined determination step, respectively, where L is an integer ranging from 0 to ($2^M$–1).

25. The circuit according to claim 20, further comprising:

setting means for setting said reference value and said subtrahend value to said comparator and said subtracter of each of said cells, respectively, said setting means comprising:

memory means for storing reference values and subtrahend values corresponding to said cells; and transfer means for transferring said reference values and subtrahend values to said cells.

26. A circuit for converting an input analog signal to a 8-bit digital signal, said circuit comprising:

first means for producing 4 analog signals from said input analog signal, said 4 analog signals consisting of said input analog signal and 3 analog signals, said 3 analog signals being produced by subtracting 3 subtrahend signals from said input analog signal, respectively, said 3 subtrahend signals having $2^{3+L}$ times a predetermined determination step, respectively, where L is an integer ranging from 0 to 3;

4 cell lines each comprising 64 cells connected in cascade, a start cell of an i-th (i=1, 2, 3, or 4) cell line of said 4 cell lines receiving an i-th analog signal of said 4 analog signals, and each of said cells producing a determination signal, each of said cells comprising:

a sample and hold circuit for sampling an analog value from a first analog signal received from a previous cell and holding said analog value;

a comparator for comparing said analog value with a reference value to produce said determination signal; and a subtracter for subtracting a subtrahend value from said analog value to produce a second analog signal which is received as said first analog signal by a next cell following said cell;

control means for controlling each of said cell lines such that said cell produces said determination signal when said next cell receives said second analog signal as said first analog signal;

a first processing circuit for producing most significant 2 bits of said 8-bit output digital signal based on said determination signals produced by first column cells of said cell lines; and a second processing circuit for producing least significant 6 bits of said 8-bit output digital signal based on said determination signals produced by second column to 64th column cells of said cell lines.

27. The circuit according to claim 26, wherein said cells operate in current mode.

28. An analog-to-digital converter circuit comprising:

a predetermined number of cells connected in cascade, a start cell receiving an input analog signal, and each of said cells producing a determination signal, each of said cells comprising:

a sample and hold circuit for sampling an analog value from a first analog signal received from a previous cell and holding said analog value;

a comparator for comparing said analog value with a reference value to produce said determination signal; and a subtracter for subtracting a subtrahend value from said analog value to produce a second analog signal which is received as said first analog signal by a next cell following said cell;

control means for controlling said cells such that said cell produces said determination signal when said next cell receives said second analog signal as said first analog signal;

first means for producing determination data based on determination signals which are sequentially produced by said cells, respectively, said determination data comprising a predetermined number of bits associated with said determination signals;

second means for converting said determination data to an output digital signal corresponding to said input analog signal;

selecting means for selecting one of said cells; and setting means for setting said reference value and said subtrahend value to said comparator and said subtracter of each of said cells, respectively, said setting means comprising:

memory means for storing reference values and subtrahend values corresponding to said cells;

transfer means for transferring said reference values and subtrahend values to said cells; and adjusting means for adjusting said reference value and said subtrahend value of a selected cell such that said determination signal of said selected cell coincides with a desired value.

29. The circuit according to claim 28, wherein said cells operate in current mode.

30. A method for converting an input analog signal to an output digital signal in an analog-to-digital converter circuit comprising a predetermined number of cells connected in cascade, a start cell receiving said input analog signal, said method comprising steps of:

sampling an analog value from a first analog signal received from a previous cell;

holding said analog value;

comparing said analog value with a reference value to produce said determination signal; and subtracting a subtrahend value from said analog value to produce a second analog signal which is received as said first analog signal by a next cell following said cell;

controlling said cells such that said cell produces said determination signal when said next cell receives said second analog signal as said first analog signal;

producing determination data based on determination signals which are sequentially produced by said cells, respectively, said determination data comprising a predetermined number of bits associated with said determination signals; and converting said determination data to an output digital signal corresponding to said input analog signal.

31. The method according to claim 30, further comprising the steps of:

selecting one of said cells;

storing said reference value and said subtrahend value to said comparator and said subtracter of each of said cells, respectively;

transferring said reference values and subtrahend values to said cells; and adjusting said reference value and said subtrahend value of a selected cell such that said determination signal of said selected cell coincides with a desired value.

\* \* \* \* \*